(12) United States Patent
Song et al.

(10) Patent No.: US 10,014,393 B2
(45) Date of Patent: Jul. 3, 2018

(54) SEMICONDUCTOR DEVICE AND METHOD OF MANUFACTURING THE SAME

(71) Applicant: SAMSUNG ELECTRONICS CO., LTD., Suwon-si, Gyeonggi-do (KR)

(72) Inventors: Seung Min Song, Yongin-si (KR); Dong Chan Suh, Suwon-si (KR); Jung Gil Yang, Suwon-si (KR); Geum Jong Bae, Suwon-si (KR); Woo Bin Song, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/361,110

(22) Filed: Nov. 25, 2016

(65) Prior Publication Data
US 2017/0358665 A1     Dec. 14, 2017

(30) Foreign Application Priority Data
Jun. 8, 2016 (KR) .................. 10-2016-0071200

(51) Int. Cl.
| H01L 21/336 | (2006.01) |
|---|---|
| H01L 29/66 | (2006.01) |
| H01L 29/06 | (2006.01) |
| H01L 29/423 | (2006.01) |
| H01L 29/49 | (2006.01) |

(52) U.S. Cl.
CPC .... H01L 29/66795 (2013.01); H01L 29/0676 (2013.01); H01L 29/4236 (2013.01); H01L 29/495 (2013.01); H01L 29/6656 (2013.01); H01L 29/66545 (2013.01); H01L 29/66666 (2013.01)

(58) Field of Classification Search
CPC .......... H01L 29/66795; H01L 29/0676; H01L 29/4236; H01L 29/495
See application file for complete search history.

(56) References Cited

U.S. PATENT DOCUMENTS

| | | | |
|---|---|---|---|
| 6,774,015 B1 | 8/2004 | Cohen et al. | |
| 7,227,176 B2 | 6/2007 | Wu et al. | |
| 8,293,608 B2 | 10/2012 | Orlowski et al. | |
| 8,900,959 B2 | 12/2014 | Chang et al. | |
| 8,969,149 B2 | 3/2015 | Leobandung | |
| 9,006,842 B2 | 4/2015 | Colinge et al. | |
| 2005/0116226 A1* | 6/2005 | Von Kanel | H01L 29/7782 257/65 |
| 2008/0246121 A1* | 10/2008 | Bensahel | H01L 21/02381 257/618 |
| 2014/0091279 A1 | 4/2014 | Kachian et al. | |
| 2015/0270340 A1 | 9/2015 | Frank et al. | |

(Continued)

*Primary Examiner* — Bradley K Smith
(74) *Attorney, Agent, or Firm* — F. Chau & Associates, LLC

(57) ABSTRACT

A method of manufacturing semiconductor device includes forming a plurality of sacrificial layers and a plurality of semiconductor layers repeatedly and alternately stacked on a substrate, partially removing the sacrificial layers, forming spacers in removed regions of the sacrificial layers, and replacing remaining portions of the sacrificial layers with a gate electrode. Each of the sacrificial layers includes first portions disposed adjacent to the plurality of semiconductor layers and a second portions disposed between the first portions. The second portion having a different composition from the first portions.

15 Claims, 16 Drawing Sheets

(56) References Cited

U.S. PATENT DOCUMENTS

| | | |
|---|---|---|
| 2015/0333162 A1 | 11/2015 | Bouche et al. |
| 2015/0372104 A1 | 12/2015 | Liu et al. |
| 2015/0372145 A1 | 12/2015 | Cheng et al. |
| 2017/0069734 A1* | 3/2017 | Doris ................. H01L 21/0228 |

* cited by examiner

SEMICONDUCTOR DEVICE AND METHOD OF MANUFACTURING THE SAME

CROSS-REFERENCE TO RELATED APPLICATION

This application claims priority under 35 U.S.C. § 119 to Korean Patent Application No. 10-2016-0071200 filed on Jun. 8, 2016 in the Korean Intellectual Property Office, the disclosure of which is incorporated by reference herein in its entirety.

TECHNICAL FIELD

Example embodiments of the present disclosure relate to a semiconductor device and a method of manufacturing the same.

DISCUSSION OF RELATED ART

A method for scaling down a semiconductor device to produce a highly integrated semiconductor device includes forming a multi-gate transistor on a substrate. The multi-gate transistor may include a fin-type or nanowire-type multi-channel active pattern or silicon body. A gate may be formed on the multi-channel active pattern.

Since such a multi-gate transistor uses a three-dimensional channel, the multi-gate transistor may be scaled down. In addition, a current control performance of the multi-gate transistor may be increased without increasing a gate length of the multi-gate transistor. Further, a short channel effect (SCE), in which an electric potential of a channel region is affected by a drain voltage, may be suppressed.

SUMMARY

Exemplary embodiments of the inventive concept provide a method of manufacturing a semiconductor device. The method includes forming a plurality of sacrificial layers and a plurality of semiconductor layers on a substrate, the semiconductor layers and the sacrificial layers being repeatedly and alternately stacked on the substrate, partially removing the sacrificial layers, forming spacers in removed regions of the sacrificial layers, and replacing remaining portions of the sacrificial layers with a gate electrode. Each of the sacrificial layers may include first portions disposed adjacent to the semiconductor layers and a second portion disposed between the first portions and having a different composition from the first portions.

Exemplary embodiments of the inventive concept provide a method of manufacturing a semiconductor device. The method includes forming, on a substrate, a fin structure in which a plurality of sacrificial patterns and a plurality of semiconductor patterns are alternately stacked on each other, in which each of the sacrificial patterns includes a first portion disposed adjacent to each of the semiconductor patterns and a second portion having a different composition from the first portion, forming a dummy gate on the fin structure, forming a first spacer on opposite sidewalls of the dummy gate, etching the sacrificial patterns and the semiconductor patterns using the dummy gate and the first spacer as an etch mask to form a plurality of sacrificial sheets and a plurality of nanosheets, etching sidewalls of the sacrificial sheets to form a spacer space, forming a second spacer in the spacer space, forming a source/drain region connected to the nanosheets, removing the dummy gate and the sacrificial sheets, forming a gate insulating layer, and forming a gate electrode.

Exemplary embodiments of the inventive concept provide a method of manufacturing a semiconductor device. The method includes forming a stacked structure disposed on a substrate. The stacked structure includes a plurality of semiconductor layers and a plurality of sacrificial layers repeatedly and alternately stacked. Sidewalls of the sacrificial layers have a concave shape structure. The method includes forming spacers in spacers provided by the concave shape structures. The method includes removing the sacrificial layers to form openings. The method includes forming a gate electrode in the openings. Each of the sacrificial layers includes first portions disposed adjacent to the semiconductor layers and a second portion disposed between the first portions. The second portion has a different composition from at least one of the first portions.

BRIEF DESCRIPTION OF THE DRAWINGS

The above and/or other features of the inventive concept will be more apparent by describing in detail exemplary embodiments thereof with reference to the accompanying drawings, in which.

DETAILED DESCRIPTION OF THE EMBODIMENTS

Figure 1:
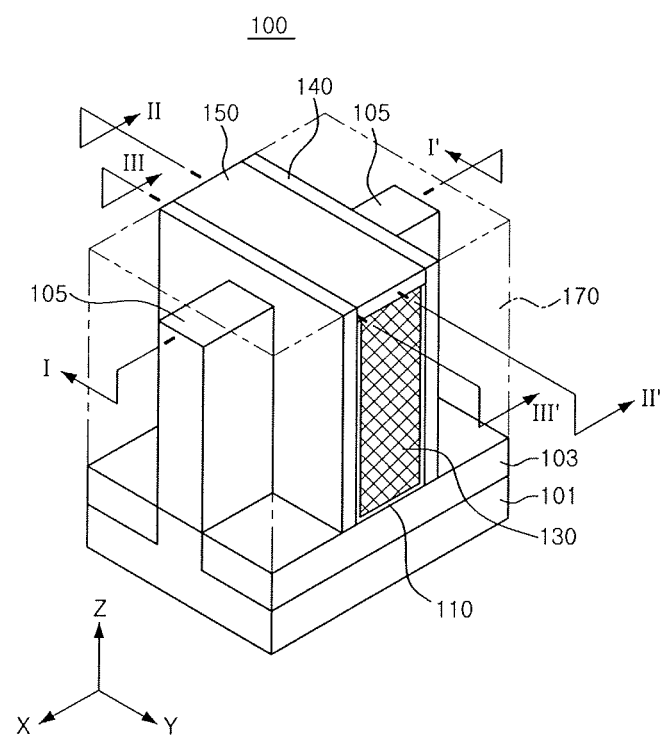
FIG. 1 is a perspective view illustrating a portion of a semiconductor device according to an exemplary embodiment of the inventive concept.

FIG. 1 is a perspective view illustrating a portion of a semiconductor device according to an exemplary embodiment of the inventive concept.

Referring to FIG. 1, a semiconductor device 100 may include a substrate 101, an isolation insulating layer 103, source/drain regions 105, a gate insulating layer 110, a gate electrode 130, a plurality of first spacers 140, and a protection layer 150.

The substrate 101 may include a protruding portion. The source/drain regions 105 may be disposed on the protruding portion. The isolation insulating layer 103 may be disposed on the substrate 101. The isolation insulating layer 103 may cover at least a portion of sidewalls of the protruding portion of the substrate 101. For example, an upper surface of the isolation insulating layer 103 may be substantially coplanar with an upper surface of the protruding portion of the substrate 101.

The gate electrode 130 may be disposed between the source/drain regions 105. The gate electrode 130 may extend in a direction, e.g., a Y-direction. Channel regions may be disposed between the source/drain regions 105. The gate electrode 130 may be formed to surround the channel regions. The gate electrode 130 may be disposed on the isolation insulating layer 103.

The first spacers 140 may be disposed on opposite sidewalls of the gate electrode 130. The first spacers 140 may extend substantially parallel to the gate electrode 130, e.g., in the Y-direction. The first spacers 140 may be referred to as outer spacers.

The gate insulating layer 110 may be disposed between the gate electrode 130 and the channel regions. The gate insulating layer 110 may also be disposed between the gate electrode 130 and the first spacers 140. The gate insulating layer 110 may be disposed between the gate electrode 130 and the isolation insulating layer 103.

The protection layer 150 may be disposed on the gate electrode 130. The protection layer 150 may protect the gate electrode 130. An interlayer insulating layer 170 may be disposed on the isolation insulating layer 103. The interlayer insulating layer 170 may surround the gate electrode 130. The interlayer insulating layer 170 may also surround the source/drain regions 105.

Figure 2:
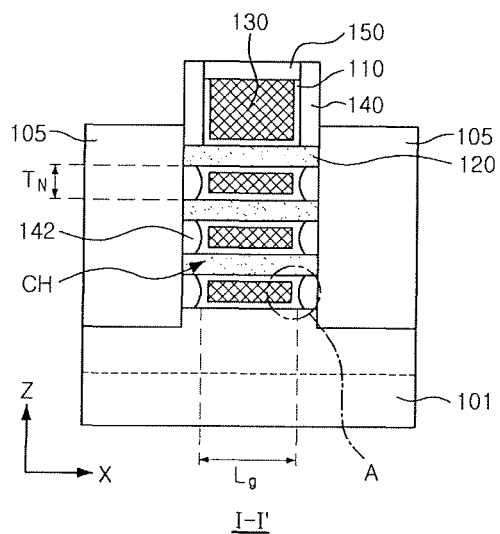
FIG. 2 is a cross-sectional view taken along a line I-I' of FIG. 1 according to an exemplary embodiment of the inventive concept.

FIG. 2 is a cross-sectional view of FIG. 1 taken along a line I-I' according to an exemplary embodiment of the inventive concept.

Referring to FIG. 2, the semiconductor device 100 may include a plurality of nanosheets 120. The nanosheets 120 may be spaced apart from each other in a vertical direction relative to an upper surface of the substrate 101, e.g., a Z-direction. The source/drain regions 105 may be connected to each other by the nanosheets 120. The gate electrode 130 may be disposed between the source/drain regions 105.

The gate electrode 130 may surround the nanosheets 120. The gate insulating layer 110 may be formed between the gate electrode 130 and the nanosheets 120. The gate electrode 130 and the gate insulating layer 110 may fill spaces between the nanosheets 120. The semiconductor device 100 may include a number and arrangement of the nanosheets 120 as illustrated in FIG. 2; however, exemplary embodiments of the inventive concept are not limited thereto.

The semiconductor device 100 may further include channel regions CH. The nanosheets 120 may be configured to include channel regions CH. Alternatively, the nanosheets 120 may be configured to serve as channel regions CH. When a voltage higher than a threshold voltage of the semiconductor device 100 is applied to the gate electrode 130, a depletion region may be formed in at least a portion of the nanosheets 120. Therefore, a current may flow between the source/drain regions 105.

The gate electrode 130 may include a work function metal layer. The gate electrode 130 may further include a gate metal layer. A barrier metal layer may be disposed between the work function metal layer and the gate metal layer. The threshold voltage of the semiconductor device 100 may be determined according to a material contained in the work function metal layer.

A gate length $L_g$ of the semiconductor device 100 may be greater than a distance $T_N$ between the vertically adjacent nanosheets 120; however, exemplary embodiments of the inventive concept are not limited thereto. The semiconductor device 100 may further include a plurality of second spacers 142. The second spacers 142 may be disposed on opposite sidewalls of the gate electrode 130. The second spacers 142 may be disposed under the first spacers 140. The gate length $L_g$ may be defined as a distance between adjacent second spacers 142 in a direction, e.g., an X-direction.

A sidewall of the second spacers 142 may have a convex shape. The convex shape of the sidewall of the second spacers 142 may be in a direction toward the gate electrode 130. The second spacers 142 may be referred to as inner spacers.

Figure 3:
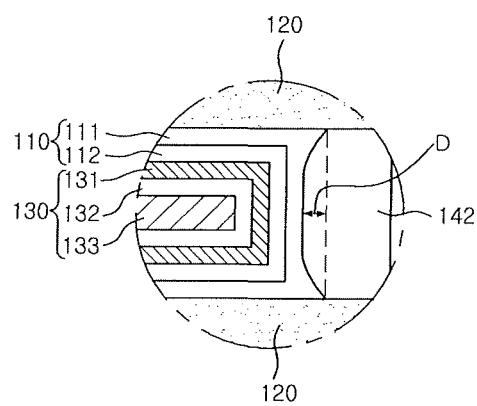
FIG. 3 is an enlarged view illustrating a portion A of FIG. 2 according to an exemplary embodiment of the inventive concept.

FIG. 3 is an enlarged view illustrating a portion A of FIG. 2 according to an exemplary embodiment of the inventive concept.

Referring to FIG. 3, the gate insulating layer 110 may include multiple layers. For example, the gate insulating layer 110 may include a first insulating layer 111. The gate insulating layer 110 may further include a second insulating layer 112. The first insulating layer 111 and the second insulating layer 112 may have different permittivities. The permittivity of the second insulating layer 112 may be higher than the permittivity of the first insulating layer 111. Accordingly, the second insulating layer 112 may be disposed closer to the gate electrode 130 than the first insulating layer 111. Therefore, the first insulating layer 111 may be disposed closer to the channel regions CH than the second insulating layer 112. The second insulating layer 112 having the relatively higher permittivity than the first insulating layer 111 may be thicker than the first insulating layer 111.

The second insulating layer 112 having the relatively higher permittivity may include a high-k dielectric material. The high-k dielectric material may include aluminum oxide ($Al_2O_3$), tantalum oxide ($TaO_2$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), or praseodymium oxide ($Pr_2O_3$) or a combination thereof; however, exemplary embodiments of the inventive concept are not limited thereto.

The barrier metal layer 131, the work function metal layer 132, and the gate metal layer 133 of the gate electrode 130 may be disposed between the nanosheets 120. The barrier metal layer 131 may be disposed adjacent to the gate insulating layer 110. The work function metal layer 132 may be disposed on the barrier metal layer 131. The gate metal layer 133 may be disposed on the work function metal layer 132. According to an exemplary embodiment of the inventive concept, spaces between the nanosheets 120 may be filled with only the gate insulating layer 110, the barrier metal layer 131, and the work function metal layer 132.

The barrier metal layer 131 may include a metal nitride, such as titanium nitride (TiN), tantalum nitride (TaN), tantalum silicon nitride (TaSiN), or titanium silicon nitride (TiSiN). A material of the work function metal layer 132 may determine the threshold voltage of the semiconductor device 100. According to an exemplary embodiment of the inventive concept, the work function metal layer 132 may include a first metal layer. The work function metal layer 132 may further include a second metal layer. The first metal layer may include different materials from the second metal layer.

The material of the work function metal layer 132 may be varied depending on whether the semiconductor device 100 is an N-type semiconductor device or a P-type semiconductor device. If the semiconductor device 100 is an N-type semiconductor device, the work function metal layer 132 may include hafnium (Hf), zirconium (Zr), titanium (Ti), tantalum (Ta), aluminum (Al) and/or a carbide thereof. If the semiconductor device 100 is a P-type semiconductor device, the work function metal layer 132 may include ruthenium (Ru), palladium (Pd), platinum (Pt), cobalt (Co), nickel and/or an oxide thereof. However, the material of the work function metal layer 132 is not limited thereto. The gate electrode 130 may include a metal, such as tungsten (W).

The second spacers 142 may include a sidewall having a convex shape. The convex shape of the sidewall may be in a direction toward the gate electrode 130. For example, the sidewall of the second spacers 142 that contact the gate insulating layer 110 may have a convex shape. The second spacers 142 may include the sidewall of which a central portion projects laterally to a protruding length D with respect to an arbitrary vertical line corresponding to a vertical sidewall. The protruding length D of the second spacers 142 may be less than about 2 nm. The protruding length D of the second spacers 142 may be, e.g., less than about 1 nm.

Referring to FIGS. 2 and 3, as the protruding length D of the second spacers 142 is reduced, a thickness variation of the second spacers 142 may be reduced. Accordingly, a variation of the gate length $L_g$ may also be reduced. By adjusting the protruding length D of the second spacers 142 below a predetermined level, a performance deviation of the semiconductor device 100 due to the variation of the gate length $L_g$ may be reduced.

Figure 4:
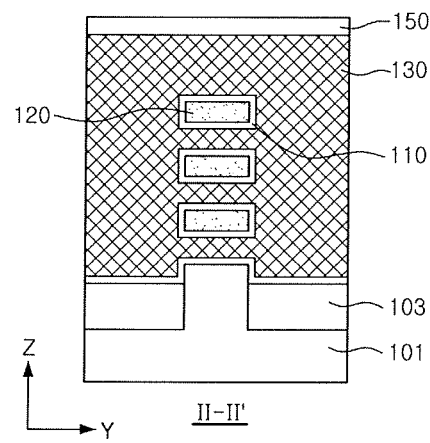
FIG. 4 is a cross-sectional view taken along a line II-IP of FIG. 1 according to an exemplary embodiment of the inventive concept.

FIG. 4 is a cross-sectional view taken along a line II-II' of FIG. 1 according to an exemplary embodiment of the inventive concept.

Referring to FIG. 4, the nanosheets 120 may be disposed on the substrate 101. The nanosheets 120 may be separated from the substrate 101. The gate insulating layer 110 may be disposed between the nanosheets 120. The gate electrode 130 may also be disposed between the nanosheets 120. Accordingly, the nanosheets 120 may be spaced apart from each other. The nanosheets 120 may be surrounded by the gate insulating layer 110. The nanosheets 120 may also be surrounded by the gate electrode 130.

Corners of the nanosheets 120 may include an angular shape as illustrated in FIG. 4; however, exemplary embodiments of the inventive concept are not limited thereto. The corners of the nanosheets 120 may have a curved shape.

Figure 5:
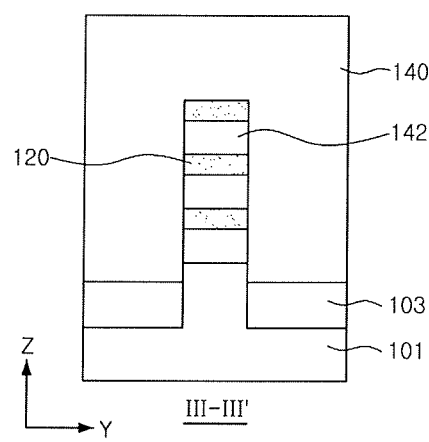
FIG. 5 is a cross-sectional view taken along a line of FIG. 1 according to an exemplary embodiment of the inventive concept.

FIG. 5 is a cross-sectional view taken along a line of FIG. 1 according to an exemplary embodiment of the inventive concept.

Referring to FIG. 5, the nanosheets 120 may be surrounded by the first spacer 140. The nanosheets 120 may also be surrounded by the second spacers 142. The second spacers 142 may be disposed between the nanosheets 120. The second spacers 142 may be separated from each other by the nanosheets 120. The second spacers 142 may also be disposed between the protruding portion of the substrate 101 and a lowermost one of the nanosheets 120. The first spacer 140 may be disposed on the isolation insulating layer 103. The first spacer 140 may partially cover the nanosheets 120. The first spacer 140 may also partially cover the second spacers 142.

FIGS. 6 to 26 illustrate a method of manufacturing a semiconductor device according to an exemplary embodiment of the inventive concept.

Figure 6:
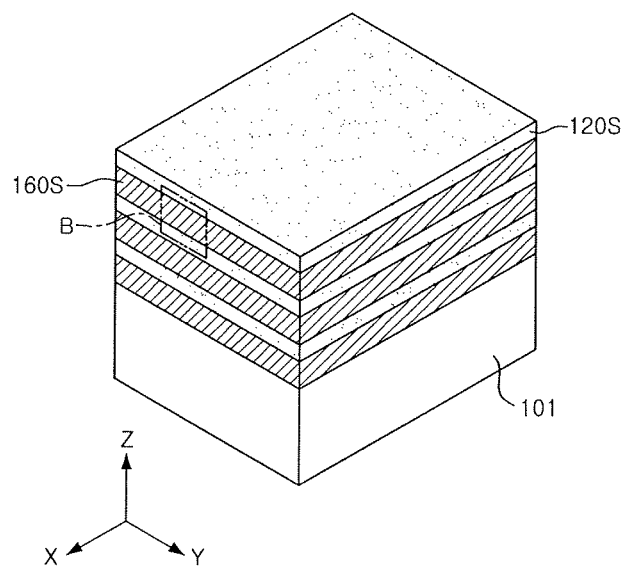
FIGS. 6 to 26 illustrate a method of manufacturing a semiconductor device according to an exemplary embodiment of the inventive concept.

Referring to FIG. 6, a stacked structure may be formed on a substrate 101. The stacked structure may include a plurality of semiconductor layers 120S. The stacked structure may further include a plurality of sacrificial layers 160S. The semiconductor layers 120S and the sacrificial layers 160S may be repeatedly and alternately stacked on the substrate 101.

The sacrificial layer 160S may be first formed on the substrate 101. The semiconductor layer 120S may then be formed on the sacrificial layer 160S. The sacrificial layer 160S may then be formed on the semiconductor layer 120S. By repeating the process, the stacked structure may be formed, in which the semiconductor layer 120S is disposed at an uppermost layer thereof. As illustrated in FIG. 6, the stacked structure may include three semiconductor layers 120S and three sacrificial layers 160S. However, exemplary embodiments of the inventive concept are not limited thereto. The number of the semiconductor layers 120S and the number of the sacrificial layers 160S may vary. For example, the stacked structure may include more than three semiconductor layers 120S and more than three sacrificial layers 160S.

The substrate 101 and the semiconductor layers 120S may include a semiconductor material. The sacrificial layers 160S may include a material having an etch selectivity with respect to the semiconductor layers 120S. The semiconductor layers 120S may include silicon (Si). The sacrificial layers 160S may include silicon germanium (SiGe).

A thickness of each of the semiconductor layers 120S and a thickness of each of the sacrificial layers 160S may be variously changed. The thickness of each of the semiconductor layers 120S may be in a range of about several nm to about several tens nm. The thickness of each sacrificial layer 160S may be greater than the thickness of each semiconductor layer 120S. For example, the thickness of each semiconductor layer 120S may be about 9 nm. The thickness of each sacrificial layer 160S may be about 12 nm. The sacrificial layers 160S may be removed by a subsequent process. Referring to FIG. 2, the gate insulating layer 110 to and the gate electrode 130 may be disposed in spaces formed by removing the sacrificial layers 160S. Therefore, the thickness of each of the sacrificial layers 160S may be substantially equal to a distance between the nanosheets 120 that provide the channel regions CH in the semiconductor device 100 of FIG. 1.

Figure 7:
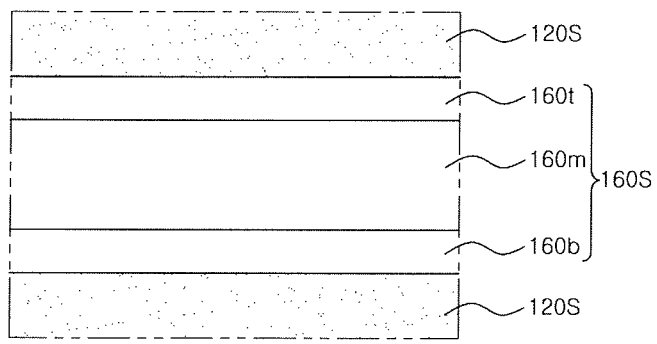

FIG. 7 is an enlarged view of a portion B of FIG. 6 according to an exemplary embodiment of the inventive concept.

Referring to FIG. 7, the sacrificial layer 160S disposed between the semiconductor layers 120S may include a plurality of portions 160*t*, 160*m*, and 160*b*. The sacrificial layer 160*s* may include an upper portion 160*t*, an intermediate portion 160*m*, and a lower portion 160*b*. The portions 160*t*, 160*m*, and 160*b* of the sacrificial layer 160S may include compositions which are different from each other. The upper portion 160*t* may contact the semiconductor layers 120S. The lower portion 160*b* may also contact the semiconductor layers 120S. The intermediate portion 160*m* may be disposed between the upper portion 160*t* and the lower portion 160*b*. The compositions of the upper portion 160*t* and the lower portion 160*b* may be different from the composition of the intermediate portion 160*m*. In a process described below, when the sacrificial layer 160S is laterally etched, e.g., sidewalls of the sacrificial layer 160S are etched, an etch rate of the sacrificial layer 160S may be low at the portion that contacts the semiconductor layer 120S. To compensate for this, the upper portion 160*t* and the lower portion 160*b* contacting the semiconductor layer 120S may have different compositions from the composition of the intermediate portion 160*m*. Therefore, an etch rate of the upper portion 160*t* and lower portion 160*b* may increase compared to an etch rate of the intermediate portion 160*m*. According to an exemplary embodiment of the inventive concept, the etch rate of the upper portion 160*t* and lower portion 160*b* may be substantially equal to the etch rate of the intermediate portion 160*m*.

A thickness of each of the upper portion 160t and the lower portion 160b may be smaller than a thickness of the intermediate portion 160m. For example, if the thickness of the sacrificial layer 160S is about 12 nm, the thickness of each of the upper portion 160t and the lower portion 160b may be about 2 nm. The thickness of the intermediate portion 160m may be about 8 nm. However, exemplary embodiments of the inventive concept are not limited thereto.

FIGS. 8A to 8E illustrate a composition of the sacrificial layer 160S of a portion B of FIG. 6 as illustrated in FIG. 7.

According to an exemplary embodiment of the inventive concept, the semiconductor layer 120S may include silicon (Si). The sacrificial layer 160S may include silicon germanium (SiGe). The upper portion 160t and the lower portion 160b of the sacrificial layer 160S may be substantially symmetrical relative to the intermediate portion 160m of the sacrificial layer 160S. The upper portion 160t of the sacrificial layer 160S will be discussed below, however, the lower portion 160b of the sacrificial layer 160S may be the same as or similar to the upper portion 160t.

Figure 8A:
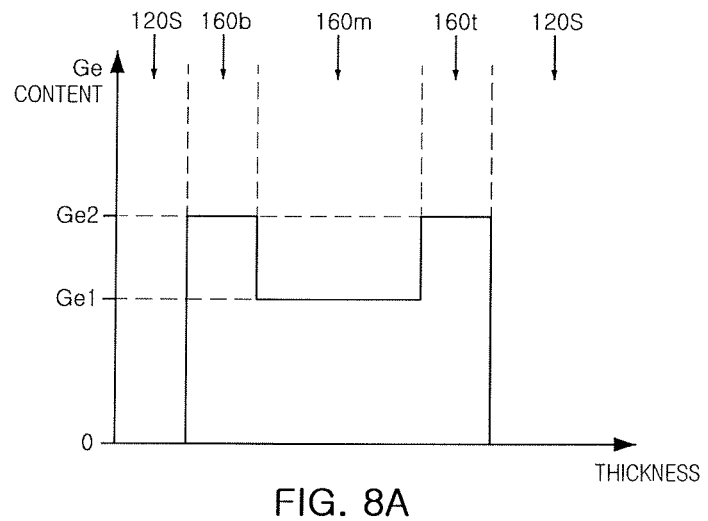

Referring to FIG. 8A, a germanium content Ge2 of the upper portion 160t may be higher than a germanium content Ge1 of the intermediate portion 160m. The germanium content Ge2 of the upper portion 160t may be about 5% to about 10% higher than the germanium content Ge1 of the intermediate portion 160m. For example, the intermediate portion 160m may include germanium (Ge) in a range of about 23% to about 25%. The upper portion 160t may include germanium (Ge) in a range of about 33% to about 35%.

Figure 8B:
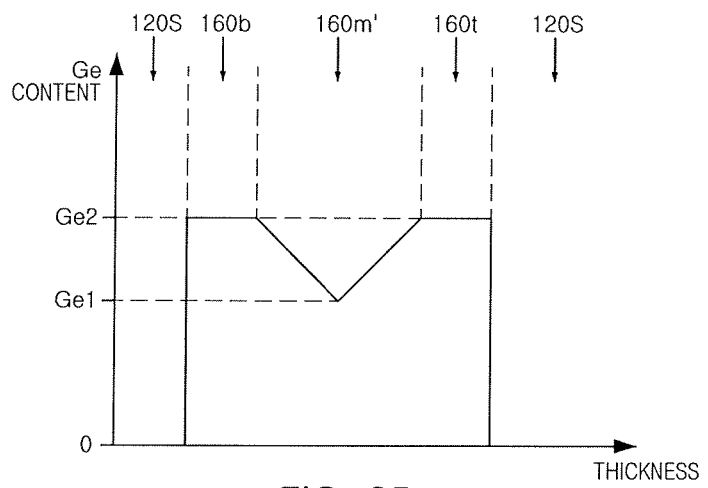

Referring to FIG. 8B, the germanium content Ge2 of the upper portion 160t may be constant. The germanium content Ge1 of the intermediate portion 160m' may decrease in a direction toward a center of the intermediate portion 160m' in a thickness direction of the sacrificial layer 160S. The germanium content Ge2 of the upper portion 160t may be in a range of about 33% to about 35%. The germanium content Ge1 of the center of the intermediate portion 160m' may be in a range of about 23% to about 25%.

Figure 8C:
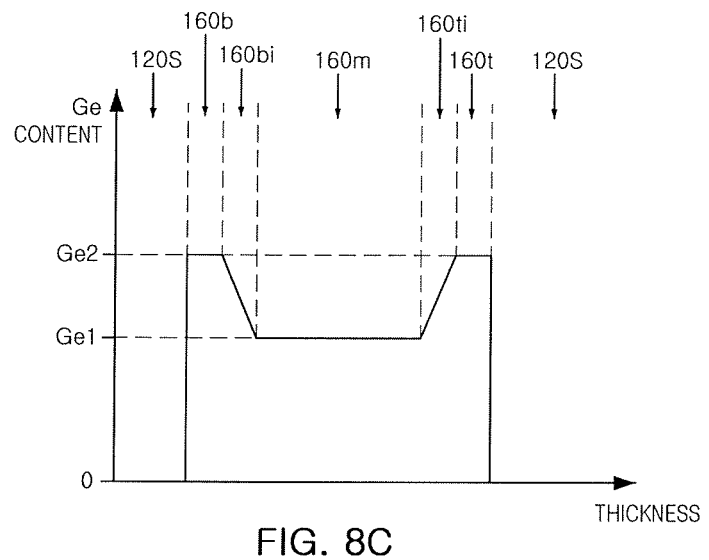

Referring to FIG. 8C, the sacrificial layer 160S may include an upper boundary portion 160ti. The upper boundary portion 160ti may be disposed between the upper portion 160t and the intermediate portion 160m. The sacrificial layer 160S may further include a lower boundary portion 160bi. The lower boundary portion 160bi may be disposed between the intermediate portion 160m and the lower portion 160b. The upper boundary portion 160ti and the lower boundary portion 160bi may include a germanium content decreasing in a direction toward the intermediate portion 160m. The germanium content Ge2 of the upper portion 160t may be in a range of about 33% to about 35%. The germanium content Ge1 of the intermediate portion 160m may be in a range of about 23% to about 25%.

Figure 8D:
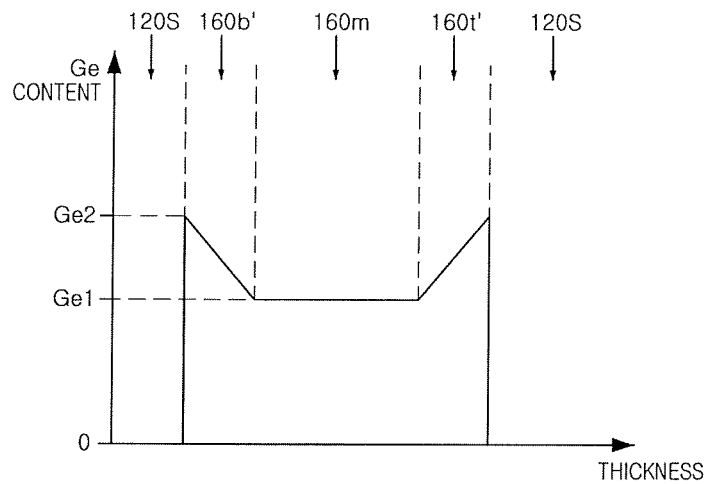

Referring to FIG. 8D, the upper portion 160t' may include a germanium content Ge2 decreasing in a direction toward the intermediate portion 160m. The intermediate portion 160m may include a constant germanium content Ge1. The germanium content Ge2 of the upper portion 160t' may be the highest at an interface in contact with the semiconductor layer 120S. The germanium content Ge2 of the upper portion 160V may be the lowest at an interface in contact with the intermediate portion 160m.

Figure 8E:
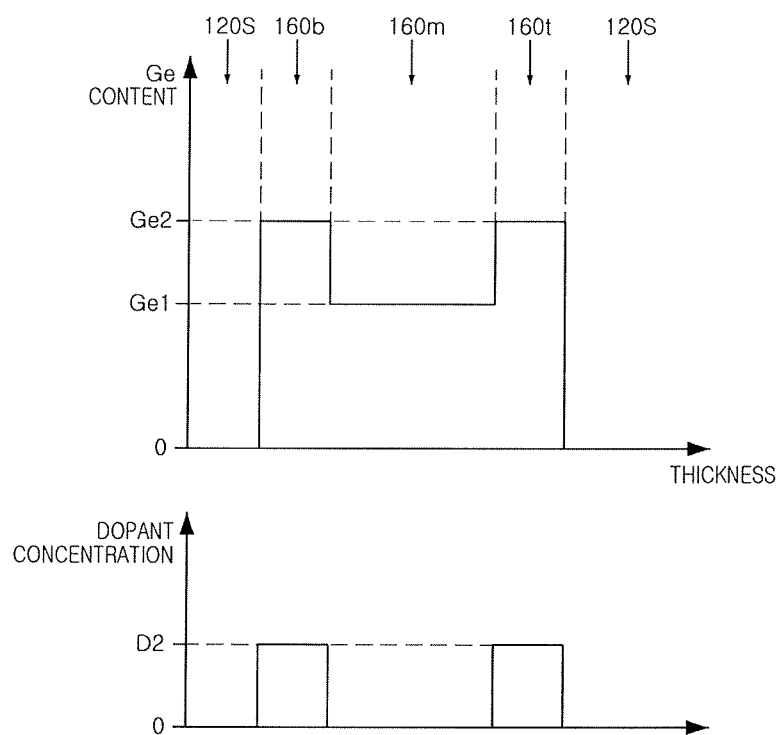

Referring to FIG. 8E, the upper portion 160t may include a high germanium content Ge2. The upper portion 160t may also include impurities. For example, the upper portion 160t may be a region doped with impurities. As the impurities are increasingly doped in the upper portion 160t, the etch rate of the upper portion 160t may increase.

Figure 9:
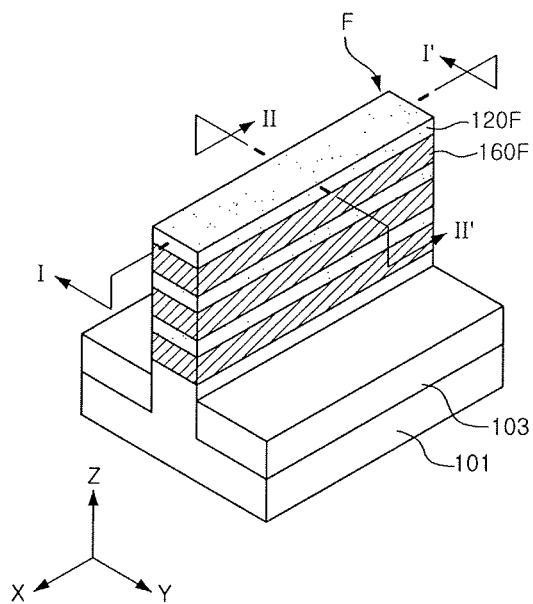
Figure 10:
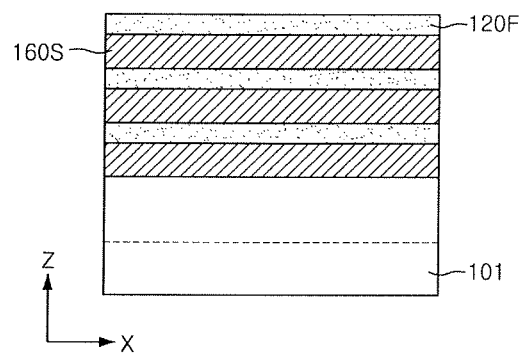
Figure 11:
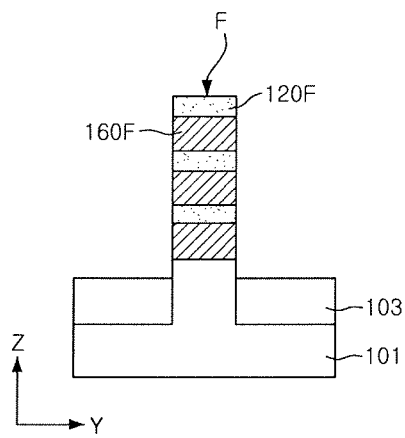

Referring to FIGS. 9 to 11, portions of the semiconductor layers 120S and the sacrificial layers 160S may be removed to form a fin structure F.

FIG. 10 is a cross-sectional view taken along a line I-I' of FIG. 9 according to an exemplary embodiment of the inventive concept. FIG. 11 is a cross-sectional view taken along a line II-IF of FIG. 9 according to an exemplary embodiment of the inventive concept.

A mask pattern may be formed on the stacked structure of the semiconductor layers 120S and the sacrificial layers 160S. An anisotropic etching process may be performed on the stacked structure of the semiconductor layers 120S and the sacrificial layers 160S using the mask pattern as an etch mask to form the fin structure F.

The fin structure F may include a plurality of semiconductor patterns 120F. The fin structure F may further include a plurality of sacrificial patterns 160F. The semiconductor patterns 120F and the sacrificial patterns 160F may be alternately and repeatedly stacked on each other.

In the process of forming the fin structure F, a portion of the substrate 101 may be removed. Accordingly, a protruding portion extending vertically from the substrate 101 may be formed. The protruding portion of the substrate 101, the semiconductor patterns 120F, and the sacrificial patterns 160F may form the fin structure F. An isolation insulating layer 103 may be formed in a region in which the portion of the substrate 101 is removed. The isolation insulating layer 103 may cover at least a portion of sidewalls of the protruding portion of the substrate 101. An upper surface of the isolation insulating layer 103 may be lower than an upper surface of the protruding portion of the substrate 101.

The fin structure F may extend on the substrate 101 in a direction, for example, an X-direction. A plurality of fin structures F may be formed on the substrate 101. The fin structures F may be spaced apart from each other. In an Y-direction crossing the X-direction, a width of the fin structure F and a distance between the adjacent fin structures F may be about several nm to about several tens nm.

Figure 12:
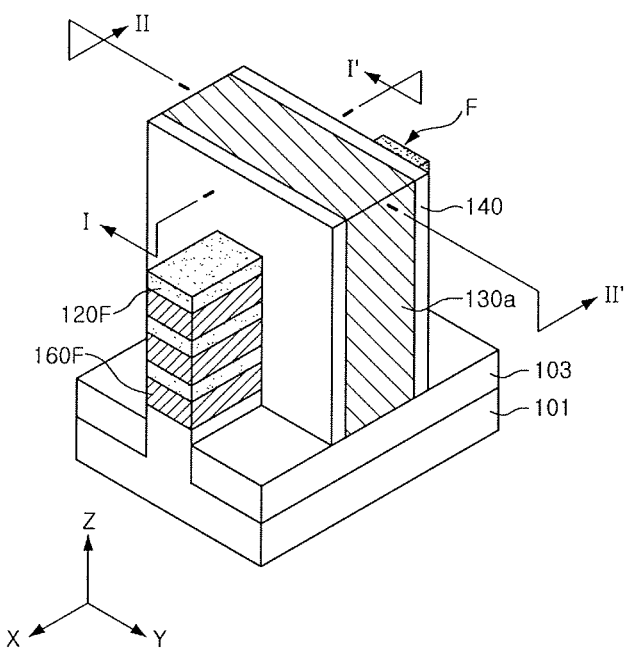
Figure 13:
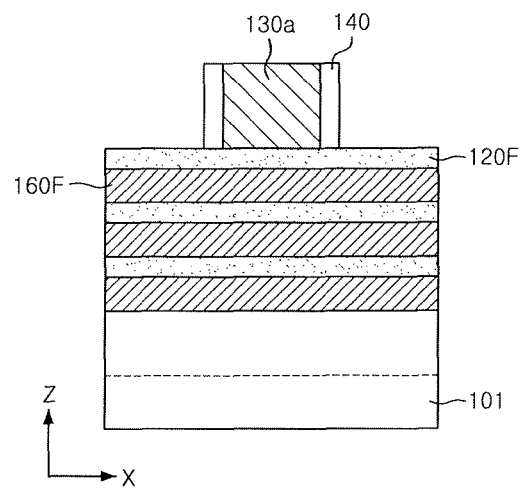
Figure 14:
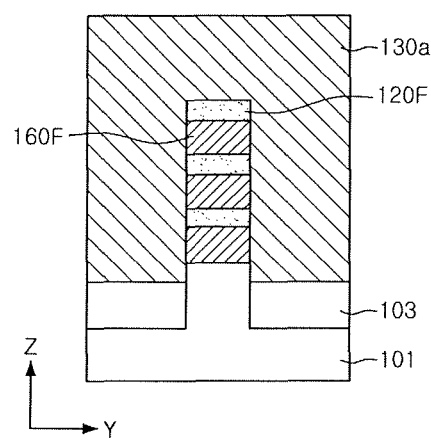

Referring to FIGS. 12 to 14, a dummy gate 130a may be formed on the fin structure F. A first spacer 140 may be formed on opposite sidewalls of the dummy gate 130a.

FIG. 13 is a cross-sectional view taken along a line I-I' of FIG. 12 according to an exemplary embodiment of the inventive concept. FIG. 14 is a cross-sectional view taken along a line II-II' of FIG. 12 according to an exemplary embodiment of the inventive concept.

Referring to FIGS. 12 to 14, a capping layer may be formed on the dummy gate 130a. An etch stop layer may be formed between the dummy gate 130a and an uppermost semiconductor pattern 120F.

The dummy gate 130a and the first spacer 140 may overlap the fin structure F. The dummy gate 130a and the first spacer 140 may extend in the Y-direction. The dummy gate 130a may include polysilicon (poly-Si). The first spacer 140 may include an insulating material, such as silicon oxynitride, silicon nitride, SiOCN, or SiBCN.

The dummy gate 130a may be replaced with the gate electrode 130 as illustrated in FIG. 2 through a gate replacement process as discussed below. Accordingly, a gate length of the gate electrode 130 may be substantially equal to a width of the dummy gate 130a in the X-direction.

Figure 15:
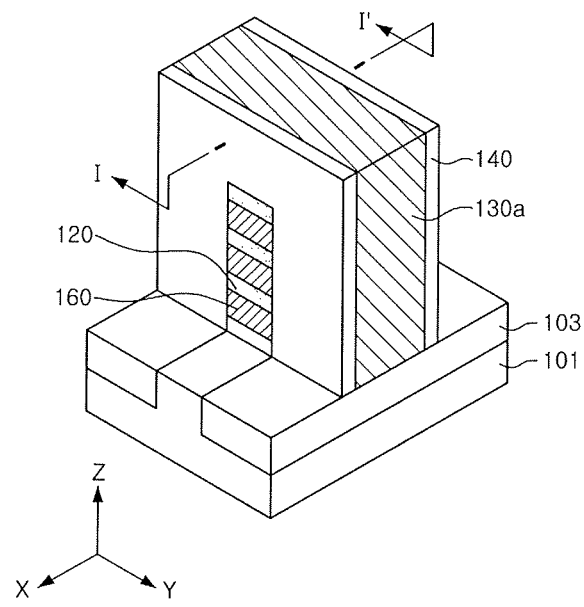
Figure 16:
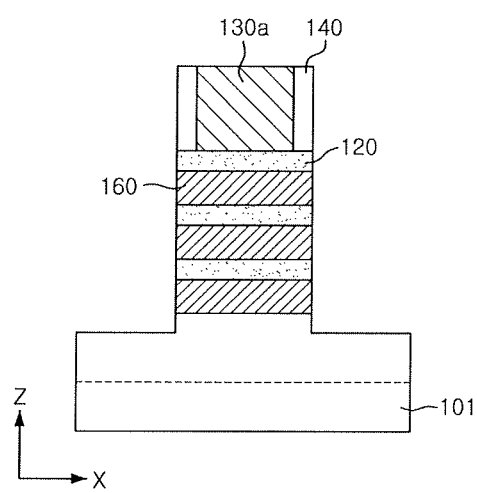

Referring to FIGS. 15 and 16, an anisotropic etch process may be performed using the dummy gate 130a and the first spacer 140 as an etch mask to form the nanosheets 120.

FIG. 16 is a cross-sectional view taken along a line I-I' of FIG. 15 according to an exemplary embodiment of the inventive concept.

A portion of the fin structure F at sides of the dummy gate 130a and the first spacer 140 may be removed by the anisotropic etch process. Therefore, the nanosheets 120 and the sacrificial sheets 160 may be formed under the dummy gate 130a. The nanosheets 120 and the sacrificial sheets 160 may also be formed under the first spacer 140. The sacrificial sheets 160 may be formed between the nanosheets 120.

The nanosheets 120 and the sacrificial sheets 160 may be surrounded by the dummy gate 130a and the first spacer 140.

Figure 21:
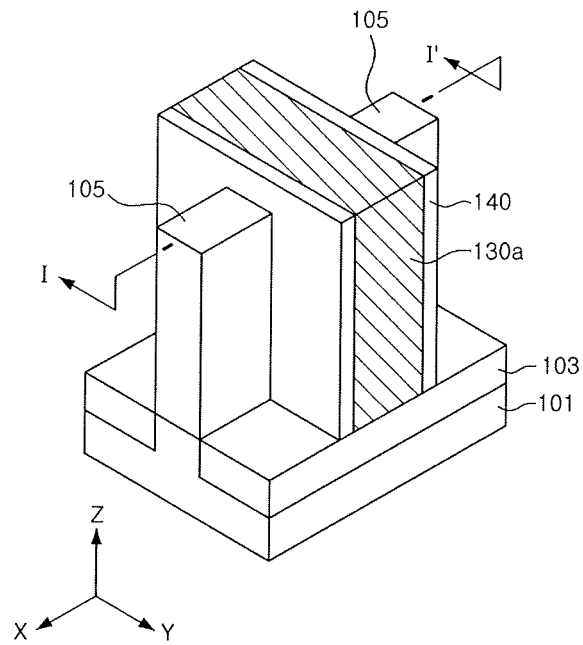

As illustrated in FIGS. 15 and 16, a portion of the upper surface of the protruding portion of the substrate 101 may be exposed at sides of the dummy gate 130a and the first spacer 140. A portion of the upper surface of the substrate 101 may be recessed. The exposed portion of the upper surface of the substrate 101 may be used in a subsequent selective epitaxial growth (SEG) process used to form source/drain regions 105 as illustrated in FIG. 21.

Figure 17:
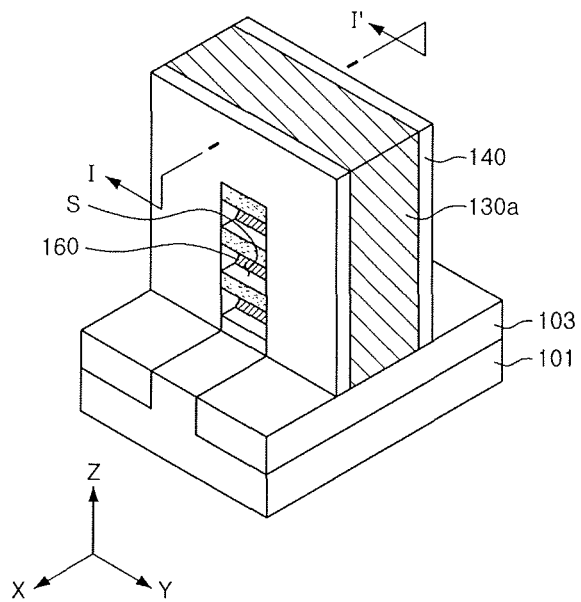
Figure 18:
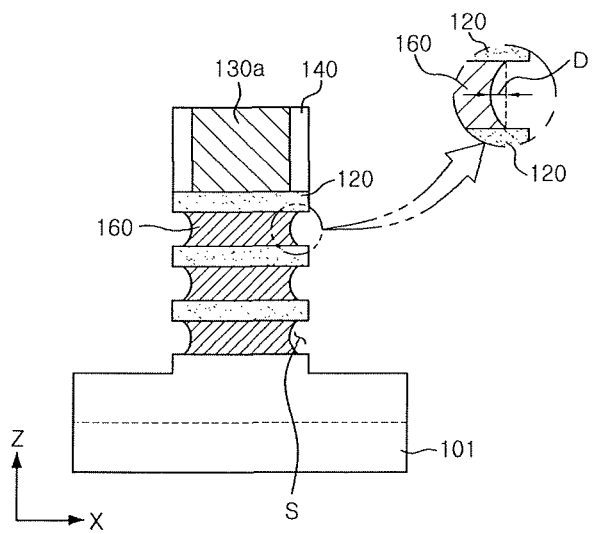

Referring to FIGS. 17 and 18, a portion of each of the sacrificial sheets 160 exposed at sides of the first spacer 140 may be removed to form a spacer space S.

FIG. 18 is a cross-sectional view taken along a line I-I' of FIG. 17 according to an exemplary embodiment of the inventive concept.

As illustrated in FIGS. 17 and 18, the portion of each of the sacrificial sheets 160 may be laterally etched, e.g., sidewalls of each of the sacrificial sheets 160 may be etched, to form the spacer space S. The lateral etching may be performed by, for example, a wet etching process. As described above, the sacrificial sheets 160 may include a different material from the nanosheets 120. The sacrificial sheets 160 may also include a material having a predetermined etch selectivity with respect to a material of the nanosheets 120. According to an exemplary embodiment of the inventive concept, the nanosheets 120 may include silicon (Si). The sacrificial sheets 160 may include silicon germanium (SiGe). In the wet etching process for the lateral etching process, an etchant having a higher selective etch rate of silicon germanium (SiGe) relative to silicon (Si) may be used. Therefore, the exposed portions of the sacrificial sheets 160 may be selectively removed while minimizing etching of the nanosheets 120. For example, the etchant may include an etching solution including hydrogen peroxide ($H_2O_2$), hydrofluoric acid (HF) and nitric acid ($CH_3COOH$), an etching solution including ammonium hydroxide ($NH_4OH$), hydrogen peroxide ($H_2O_2$) and de-ionized water ($H_2O$), an etching solution including peracetic acid, and/or a combination thereof.

Sidewalls of each of the sacrificial sheets 160 may have a concave shaped structure as a result of the lateral etching. As described with reference to FIGS. 7 to 8E, the upper portion 160t and the lower portion 160b of the sacrificial sheets 160 in contact with the nanosheets 120 may be formed to have different compositions from the intermediate portion 160m. Therefore, a depth D of the concave shape structure may be less than about 2 nm. The depth D of the concave shape structure may be less than about 1 nm.

Figure 20:
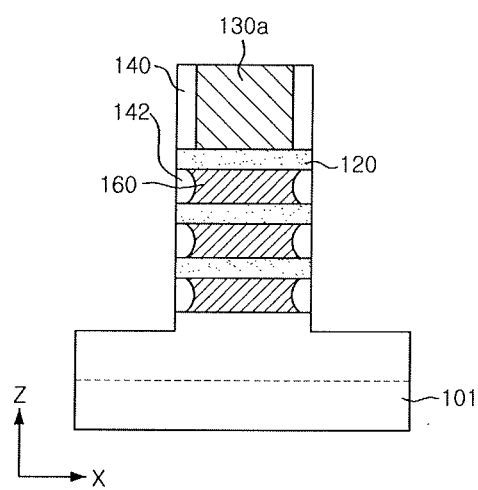

According to an exemplary embodiment of the inventive concept, by reducing the depth D of the concave shape structure, a form of a second spacer 142 as illustrated in FIG. 20 may become more uniform. A variation of gate length and a non-uniformity of a gate electrode formed in the following gate replacement process may also be lessened.

Figure 19:
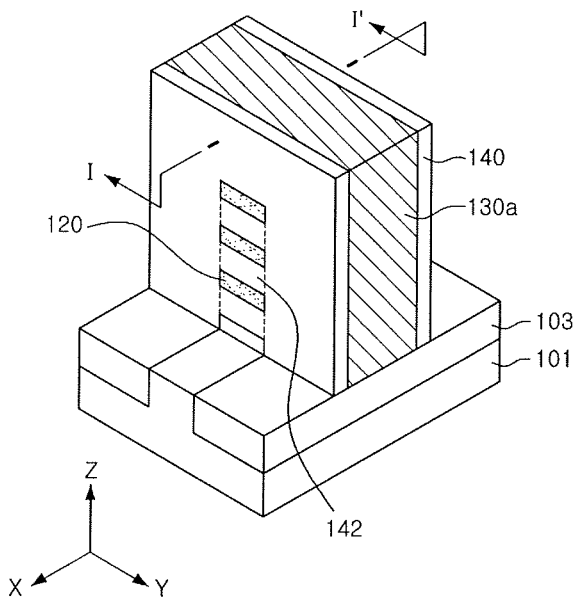

Referring to FIGS. 19 and 20, the spacer 142 may be formed by filling the spacer space S with an insulating material.

FIG. 20 is a cross-sectional view taken along a line I-I' of FIG. 19 according to an exemplary embodiment of the inventive concept.

The second spacer 142 may be formed by depositing the insulating material on the substrate 101 to fill the spacer space S. The insulating material deposited on a region except for the spacer space S may be removed by an anisotropic etching process. A plurality of second spacers 142 may be formed in a plurality of the spacer spaces S.

The second spacers 142 may include substantially the same material as the first spacer 140; however, exemplary embodiments of the inventive concept are not limited thereto. For example, the second spacers 142 may include silicon oxynitride, silicon nitride, SiOCN and/or SiBCN.

Figure 22:
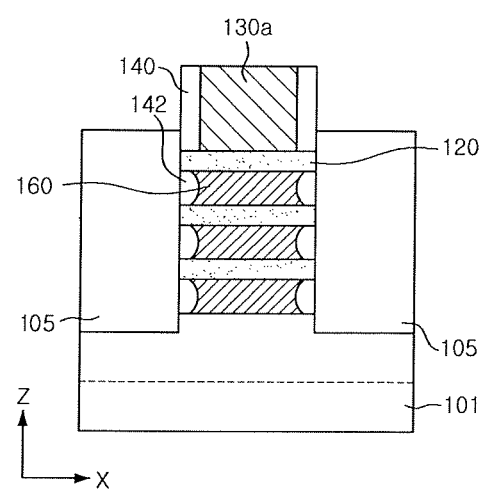

Referring to FIGS. 21 and 22, the source/drain regions 105 may be formed on the upper surface of the substrate 101 using a selective epitaxial growth process.

FIG. 22 is a cross-sectional view taken along a line I-I' of FIG. 21 according to an exemplary embodiment of the inventive concept.

Figure 26:
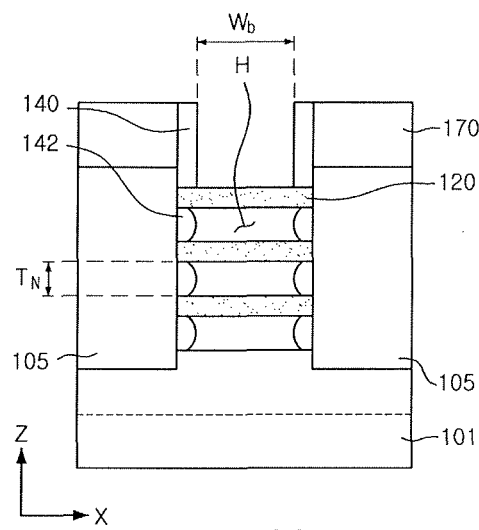

The source/drain regions 105 may each include a semiconductor material. The semiconductor material may be doped with impurities. A thickness of the source/drain regions 105 may be varied. As illustrated in FIGS. 26 to 28, upper surfaces of the source/drain regions 105 may be disposed above an uppermost one of the nanosheets 120. Alternatively, upper surfaces of the source/drain regions 105 may be substantially coplanar with an upper surface of the uppermost one of the nanosheets 120.

Figure 23:
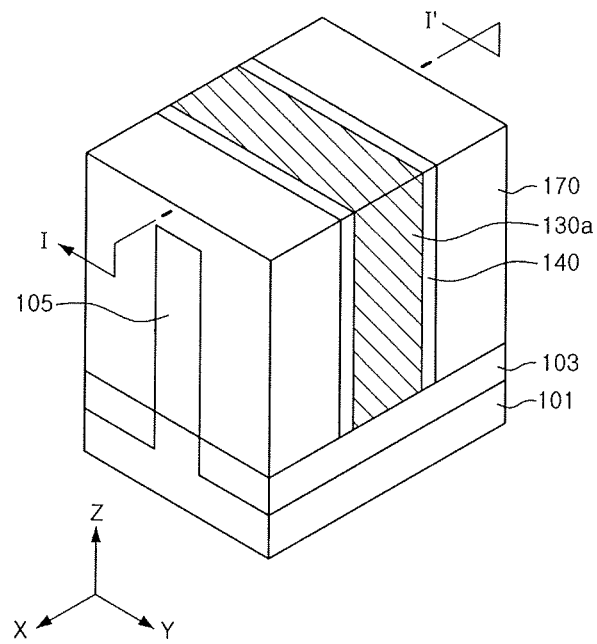
Figure 24:
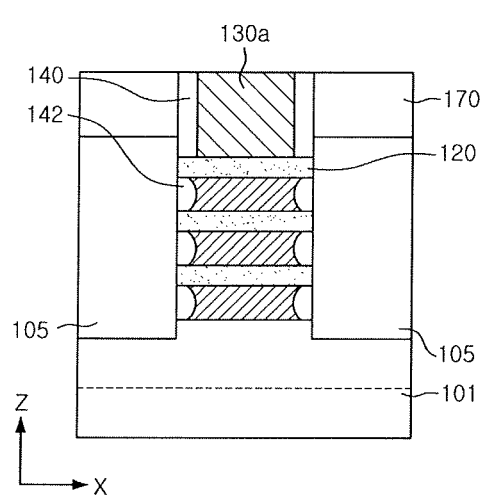

Referring to FIGS. 23 and 24, an interlayer insulating layer 170 may be formed. The interlayer insulating layer 170 may be formed on outer sidewalls of the first spacer 140. The interlayer insulating layer 170 may cover the source/drain regions 105.

FIG. 24 is a cross-sectional view taken along a line I-I' of FIG. 23 according to an exemplary embodiment of the inventive concept.

For example, a portion of the interlayer insulating layer 170 may be formed before the source/drain regions 105 are formed. The source/drain regions 105 may be formed in openings in the interlayer insulating layer 170.

Figure 25:
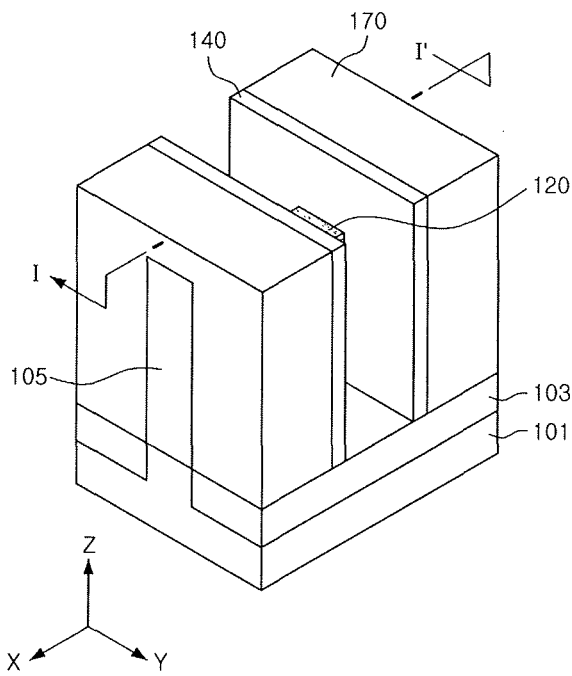

Referring to FIGS. 25 and 26, the dummy gate 130a and the sacrificial sheets 120 may be removed.

FIG. 26 is a cross-sectional view taken along a line I-I' of FIG. 25 according to an exemplary embodiment of the inventive concept.

The dummy gate 130a may be selectively removed using an etch selectivity between the dummy gate 130a, the first spacer 140, and the source/drain regions 105. Therefore, the nanosheets 120 and the sacrificial sheets 160 may be exposed in an opening between the adjacent first spacers 140.

The sacrificial sheets 160 may then be removed to form horizontal openings H. As described above, the sacrificial sheets 160 may include a different material from the nanosheets 120. For example, the sacrificial sheets 160 may include a material having a predetermined etch selectivity with respect to a material included in the nanosheets 120. For example, the nanosheets 120 may include a material configured to provide a channel region of the semiconductor device 100, for example, silicon (Si). The sacrificial sheets 160 may include silicon germanium (SiGe). To selectively remove the sacrificial sheets 160, an etchant having a higher selective etch rate for silicon germanium (SiGe) relative to silicon (Si) may be used. For example, the etchant may include an etching solution including hydrogen peroxide ($H_2O_2$), hydrofluoric acid (HF) and nitric acid ($CH_3COOH$), an etching solution including ammonium hydroxide ($NH_4OH$), hydrogen peroxide ($H_2O_2$) and de-ionized water ($H_2O$), an etching solution including peracetic acid, and/or a combination thereof. When the sacrificial sheets 160 are removed, the nanosheets 120 may be separated from each other. As illustrated in FIG. 26, the nanosheets 120 may be spaced apart from each other in a Z-direction. A distance $T_N$ between the nanosheets 120 may be less than a distance $W_D$ between the adjacent first spacers 140.

Referring to FIGS. 1 to 5, the gate insulating layer 110 and the gate electrode 130 may be formed in the horizontal openings H and in the opening between the adjacent first spacers 140.

The gate insulating layer 110 may be formed on an inner sidewall of the first spacer 140 and on the upper surface of the uppermost one of the nanosheets 120. The gate insulating layer 110 may also be formed in the horizontal openings H between the nanosheets 120. For example, the gate insulating layer 110 may be formed to surround the plurality of nanosheets 120 in the Y-direction and the Z-direction. The gate insulating layer 110 may include the first insulating layer 111. The gate insulating layer may further include the second insulating layer 112. The first insulating layer 111 may have a different permittivity from the second insulating layer 112. The first insulating layer 111 may be formed closer to the nanosheet 120 and the first and second spacers 140 and 142 than the second insulating layer 112. The gate insulating layer 110 may be formed by a chemical vapor deposition (CVD) process or an atomic layer deposition (ALD) process. According to an exemplary embodiment of the inventive concept, the second insulating layer 112 may be formed to be thicker than the first insulating layer 111. For example, a thickness of the first insulating layer 111 may be less than about 1 nm and a thickness of the second insulating layer 112 may be in a range of about 1 nm to about 2 nm.

The barrier metal layer 131, the work function metal layer 132 and the gate metal layer 134 constituting the gate electrode 130 may be sequentially formed on the gate insulating layer 110. The protection layer 150 may further be formed on the gate metal layer 134.

The protection layer 150 may include a silicon nitride layer. The protection layer 150 may have a thickness of about several tens Å to about several hundreds Å. The protection layer 150 may be formed to prevent a threshold voltage of the semiconductor device from being changed due to penetration of oxygen into the gate electrode 130. A portion of the gate electrode 130 may be removed to form the protection layer 150. The protection layer 150 may be provided in the removed region of the gate electrode 130.

According to exemplary embodiments of the present inventive concept, since the inner spacer and the gate electrode are uniformly formed, the variation of the gate length can be reduced, thereby decreasing a deviation of performance of the semiconductor device.

While exemplary embodiments of the present inventive concept have been particularly shown and described with reference to exemplary embodiments thereof, it will be understood by those of ordinary skill in the art that various changes in form and details may be made therein without departing from the spirit and scope of the present inventive concept as defined by the following claims.

What is claimed is:

1. A method of manufacturing a semiconductor device, the method comprising:
    forming a plurality of sacrificial layers and a plurality of semiconductor layers on a substrate, the semiconductor layers and the sacrificial layers being repeatedly and alternately stacked on the substrate;
    partially removing the sacrificial layers;
    forming spacers in removed regions of the sacrificial layers; and
    replacing remaining portions of the sacrificial layers with a gate electrode,
    wherein each of the sacrificial layers includes first portions disposed adjacent to the semiconductor layers and a second portion disposed between the first portions, the second portion having a different composition from the first portions,
    wherein the sacrificial layers include silicon germanium, and a germanium content of the first portions is higher than a germanium content of the second portion, and
    wherein the first portions include impurities.

2. The method according to claim 1, wherein partially removing the sacrificial layers includes laterally etching the sacrificial layers, and an etch rate of the first portions is higher than an etch rate of the second portion.

3. The method according to claim 1, wherein the germanium content of the first portions is 5% to 10% higher than the germanium content of the second portion.

4. The method according to claim 1, wherein the germanium content of the first portions is constant, and the germanium content of the second portion decreases toward a center of the second portion.

5. The method according to claim 1, wherein each of the sacrificial layers further comprises a boundary part, the boundary part disposed between the first portions and the second portion, and
    the boundary part includes a germanium content decreasing toward the second portion.

6. The method according to claim 1, wherein the germanium content of the first portions decreases toward the second portion, and
    the germanium content of the second portion is constant.

7. The method according to claim 1, wherein a thickness of each of the first portions is smaller than a thickness of the second portion.

8. A method of manufacturing a semiconductor device, the method comprising:
    forming, on a substrate, a fin structure in which a plurality of sacrificial patterns and a plurality of semiconductor patterns are alternately stacked on each other, wherein each of the sacrificial patterns includes a first portion disposed adjacent to each of the plurality of semiconductor patterns and a second portion having a different composition from the first portion;
    forming a dummy gate on the fin structure;
    forming a first spacer on opposite sidewalls of the dummy gate;
    etching the sacrificial patterns and the semiconductor patterns using the dummy gate and the first spacer as an etch mask to form a plurality of sacrificial sheets and a plurality of nanosheets;
    etching sidewalls of the sacrificial sheets to form a spacer space;
    forming a second spacer in the spacer space;
    forming a source/drain region connected to the nanosheets;
    removing the dummy gate and the sacrificial sheets;
    forming a gate insulating layer; and
    forming a gate electrode, wherein each of the sacrificial patterns include silicon germanium, and a germanium content of the first portions is about 5% to about 10% higher than a germanium content of the second portion.

9. The method according to claim 8, wherein the germanium content of the first portion is constant, and the germanium content of the second portion decreases toward a center of the second portion.

10. The method according to claim 8, wherein each of the sacrificial patterns further comprises a boundary part, the boundary part is disposed between the first portion and the second portion, and the boundary part includes a germanium content decreasing toward the second portion.

11. The method according to claim 8, wherein the germanium content of the first portion decreases in a direction toward the second portion, and the germanium content of the second portion is constant.

12. A method of manufacturing a semiconductor device, the method comprising:

forming a stacked structure disposed on a substrate, the stacked structure including a plurality of semiconductor layers and a plurality of sacrificial layers repeatedly and alternately stacked, wherein sidewalls of the sacrificial layers have a concave shape structure;

forming spacers in spaces provided by the concave shape structures;

removing the sacrificial layers to form openings; and forming a gate electrode in the openings, wherein each of the sacrificial layers includes first portions disposed adjacent to the semiconductor layers and a second portion disposed between the first portions, the second portion having a different composition from at least one of the first portions, and wherein a depth of the concave shape structure is less than about 2 nm.

13. The method according to claim 12, wherein the sacrificial layers include silicon germanium, and a germanium content of the first portions is higher than a germanium content of the second portion.

14. The method according to claim 12, wherein a thickness of each of the sacrificial layers is greater than a thickness of each of the semiconductor layers.

15. The method according to claim 13, wherein the germanium content of the first portions is 5% to 10% higher than the germanium content of the second portion.

* * * * *